US010060405B2

United States Patent

(12) United States Patent
Ishii et al.

(10) Patent No.: US 10,060,405 B2

(45) Date of Patent: Aug. 28, 2018

(54) SWITCH APPARATUS AND IGNITION DEVICE

(71) Applicant: FUJI ELECTRIC CO., LTD., Kanagawa (JP)

(72) Inventors: Kenichi Ishii, Matsumoto (JP); Noriyuki Hemmi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 9 days.

(21) Appl. No.: 15/446,006

(22) Filed: Mar. 1, 2017

(65) Prior Publication Data

US 2017/0268475 A1 Sep. 21, 2017

(30) Foreign Application Priority Data

Mar. 18, 2016 (JP) ................................ 2016-055836

(51) Int. Cl.

| | |
|---|---|
| ***F02P 3/05*** | (2006.01) |
| ***H01F 38/12*** | (2006.01) |
| ***H03K 17/08*** | (2006.01) |
| ***F02P 3/055*** | (2006.01) |
| ***H01L 23/495*** | (2006.01) |
| ***H01L 27/02*** | (2006.01) |
| ***H01L 27/06*** | (2006.01) |

(Continued)

(52) U.S. Cl.

CPC ............ *F02P 3/0554* (2013.01); *H01F 38/12* (2013.01); *H01L 23/49575* (2013.01); *H01L 27/0288* (2013.01); *H01L 27/0296* (2013.01); *H01L 27/0623* (2013.01); *H01L 29/0619* (2013.01); *H01L 29/0804* (2013.01); *H01L 29/1004* (2013.01); *H01L 29/7395* (2013.01); *H03K 17/08* (2013.01); *H03K 17/60* (2013.01)

(58) Field of Classification Search

CPC ..... F02P 3/05; F02P 3/0554; H01L 23/49575; H01L 27/0288; H01L 27/0296; H01L 27/0623; H01L 29/0619; H01L 29/0804; H01L 29/1004; H01L 29/7935; H03K 17/08; H03K 17/08126; H03K 17/60

See application file for complete search history.

(56) References Cited

U.S. PATENT DOCUMENTS 6,539,928 B2 * 4/2003 Kohno ...................... F02P 3/04 123/605

6,595,194 B1 * 7/2003 Ito ........................ F02P 3/0435 123/644

(Continued)

FOREIGN PATENT DOCUMENTS

JP S62-21267 A 1/1987

JP 2014-99535 A 5/2014

*Primary Examiner* — Hieu T Vo

(57) ABSTRACT

Provided is a switch apparatus including a conductor; a switching device that contacts the conductor on a first surface and switches between a first terminal on the first surface side and a second terminal on a second surface side that is opposite to the first surface; and a control device that contacts the conductor on a third surface and includes a control circuit of the switching device provided on a fourth surface side opposite to the third surface and a first withstand voltage structure that protects the control circuit from excessive voltage added to the conductor. By providing the withstand voltage structure in the control device, it is possible to protect the control circuit.

12 Claims, 9 Drawing Sheets

100

11a 10 11 16 50 30 70 18 17 13 11b 12

(51) Int. Cl.

| | |
|---|---|
| ***H01L 29/06*** | (2006.01) |
| ***H01L 29/08*** | (2006.01) |
| ***H01L 29/10*** | (2006.01) |
| ***H01L 29/739*** | (2006.01) |
| ***H03K 17/60*** | (2006.01) |

(56) References Cited

U.S. PATENT DOCUMENTS

| | | | | |
|---|---|---|---|---|
| 8,283,697 | B2 * | 10/2012 | Ueno | H01L 29/0696 257/140 |
| 8,803,190 | B2 * | 8/2014 | Nakamura | H01L 27/0647 257/140 |
| 9,920,736 | B2 * | 3/2018 | Tang | F02P 17/12 |
| 2011/0133246 | A1 | 6/2011 | Ueno | |

* cited by examiner

SWITCH APPARATUS AND IGNITION DEVICE

The contents of the following Japanese patent application are incorporated herein by reference:

NO. 2016-055836 filed on Mar. 18, 2016.

BACKGROUND

1. Technical Field

The present invention relates to a switch apparatus and an ignition device.

2. Related Art

An engine of an automobile or the like introduces a mixed gas of fuel and air into a combustion chamber, and generates drive power by igniting and combusting the mixed gas using an ignition plug. An ignition device and a switch apparatus (referred to as an ignitor) are allocated for each ignition plug.

Conventionally, a one-chip ignitor is known in which a switching device and a control device are arranged on the same chip, as shown in Patent Document 1, for example. The switching device includes an insulated gate bipolar transistor (IGBT) that cuts off current conducted on a primary coil of the ignition coil. The control device includes a control circuit that controls operation of the IGBT. Here, the control circuit does not turn the IGBT ON and OFF by receiving a control signal from an engine control unit (ECU), and instead has a function to turn OFF the IGBT regardless of the control signal of the ECU by detecting an abnormality in the IGBT.

Patent Document 1: Japanese Patent Application Publication No. 2011-119542

There are several problems in a one-chip ignitor. For example, in addition to the control signal, the ECU inputs to the ignitor detection signals for detecting a disconnection between the ECU and the ignitor, decay of a terminal of the ignitor, or the like. When an interface for receiving these detection signals is provided in the ignitor, the chip becomes larger and the manufacturing cost is increased. Furthermore, parasitic current of the IGBT flows into the control device. Therefore, when a self-separating region is provided between the switching device and the control device, the chip becomes larger and the manufacturing cost is increased. Accordingly, a multi-chip ignitor is desired in which the switching device and the control device are arranged respectively on different chips and power supply voltages are received from power supplies independent from the ECU.

On the other hand, in a multi-chip ignitor, there is a problem that there is a decrease in the field decay endurance, i.e. the endurance to a negative surge voltage (referred to simply as "negative surge") such as a field decay surge. Here, after the IGBT has entered the ON state and become conductive, the ignitor turns OFF the IGBT and conduction is cut off. When the conduction is cut off, the ignition plug discharges due to the high voltage generated by the ignition coil, thereby igniting the mixed gas. However, in a case where the ignition plug has not discharged, i.e. a case where ignition was not performed, a high voltage is applied to the IGBT as a negative surge, and a negative surge current flows from the emitter to the collector of the IGBT. At this time, when the chip is damaged due to dicing, the surge current is particularly focused at the PN junction between an $n^+$-type buffer layer and a $p^+$-type semiconductor substrate.

In a multi-chip ignitor, the edge length of each chip is shortened as a result of separating the chips into the switching device and the control device, and a decrease in the endurance to a negative surge can be caused by the surge current being focused in a portion of the PN junction.

SUMMARY

According to a first aspect of the present invention, provided is a switch apparatus comprising a conductor; a switching device that contacts the conductor on a first surface and switches between a first terminal on the first surface side and a second terminal on a second surface side that is opposite to the first surface; and a control device that contacts the conductor on a third surface and includes a control circuit of the switching device provided on a fourth surface side opposite to the third surface and a first withstand voltage structure that protects the control circuit from excessive voltage added to the conductor.

According to a first second of the present invention, provided is a switch apparatus comprising a conductor; a switching device that contacts the conductor on a first surface and switches between a first terminal on the first surface side and a second terminal on a second surface side that is opposite to the first surface; and a control device that contacts the conductor on a third surface and includes a control circuit of the switching device provided on a fourth surface side opposite to the third surface, wherein the control device has a higher withstand voltage between the surfaces thereof than the switching device.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
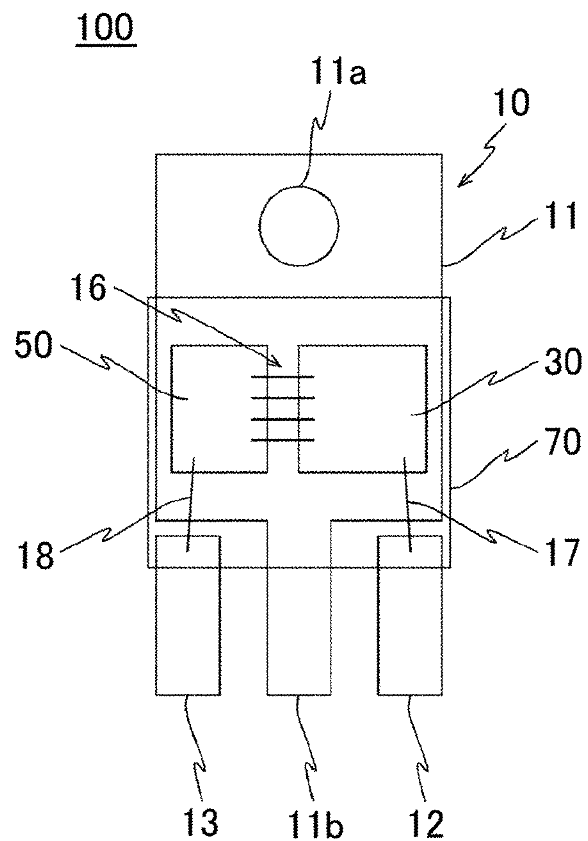
FIG. 1 shows an overall configuration of an ignitor.

FIG. 1 shows an overall configuration of an ignitor 100. The ignitor 100 is one example of a switch apparatus, and is intended to minimize the chip size of a multi-chip ignitor and preserve the field decay endurance, particularly to protect a control circuit.

The ignitor 100 includes a lead frame 10 serving as a conductor, a switching device 30, a control device 50, wires 16, 17, and 18, and a package 70.

The lead frame 10 has the switching device 30 and the control device 50 mounted thereon to be supported thereby. The lead frame 10 is molded as a board using metal with high thermal conductivity, for example, in order to release the heat emitted by these devices. The lead frame 10 includes a main body 11 and one or more terminals 11*b*, 12, and 13.

The main body 11 has a rectangular shape in which a longitudinal direction is one axial direction, i.e. the up-down direction in FIG. 1, for example. One side of the main body 11 in the longitudinal direction supports the switching device 30 and the control device 50 thereon, and functions as a collector electrode shared by these devices. The other side of the main body 11 in the longitudinal direction has a circular opening 1 la formed therein, for example.

The one or more terminals 11*b*, 12, and 13 are terminals that couple the circuit elements of the switching device 30, the control device 50, and the like included in the ignitor 100 when the ignitor 100 is implemented. In the present example, three terminals 11*b*, 12, and 13 are included, for example.

The terminal 11*b* has a rectangular shape with a narrower width than the main body 11 and a longitudinal direction in the one axial direction, and the base end of the terminal 11*b* is connected integrally with a center of the end portion on one side of the main body 11 in the longitudinal direction. In this way, the terminal 11*b* is connected to the main body 11, i.e. the collector electrode of the switching device 30 and the control device 50, and functions as a collector terminal. Alternatively, the terminal 11*b* may be formed independently from the main body 11, and may be connected to the main body 11 using wires or the like.

The terminals 12 and 13 each have a rectangular shape with a longitudinal direction in the one axial direction and are provided in parallel with the terminal 11*b* on one side and another side thereof in the left-right direction in the drawing to sandwich the terminal 11*b*, and the tips of the terminals 12 and 13 are aligned with the tip of the terminal 11*b*. The terminal 12 is connected to the switching device 30 (specifically an emitter pad 33 included in the switching device 30) via a wire 17 that is described further below, and functions as an emitter terminal. The terminal 13 is connected to the control device 50 (specifically a gate pad 53 included in the control device 50) via a wire 18 that is described further below, and functions as a gate terminal.

The number of terminals 11*b*, 12, and 13 is not limited to three, and may be four or more. For example, two terminals 13 may be provided in parallel and a protective element may be connected between these terminals 13. The protective element is, for example, a capacitor, a resistor, or the like that absorbs a surge voltage. Furthermore, another terminal may be connected to a ground potential of the control device 50, and clamp the switching device 30 and the control device 50 independently at the ground potential. In a case where a power supply voltage is received from an ECU and an independent power supply, one or more terminals for the power supply may be further added, these power supply terminals may be connected respectively to the power supplies, and the power supply voltage may be supplied to a control circuit included in the control device 50.

The switching device 30 is a semiconductor device that switches between the terminal 11*b*, i.e. the collector terminal, and the terminal 12, i.e. the emitter terminal. The switching device 30 is formed including an insulated gate bipolar transistor (IGBT), for example. The switching device 30 is not limited to being an IGBT, and may include a vertical metal oxide semiconductor field effect transistor (vertical MOSFET) in which current flows from the back surface to the front surface of the chip, for example. The switching device 30 is installed near the base end of the terminal 12 on the main body 11 of the lead frame 10. The details of the configuration of the switching device 30 are described further below.

The control device 50 is a semiconductor device including a control circuit that controls the operation of the switching device 30. The control circuit is formed including a metal oxide semiconductor field effect transistor (MOSFET), for example. The control device 50 is installed near the base end of the terminal 13 on the main body 11 of the lead frame 10. The control device 50 is connected to the switching device 30 via a plurality of wires 16 that are described further below, and transmits a control signal for controlling the IGBT to the switching device 30, senses the collector potential of the IGBT, and/or shares the emitter potential of the IGBT, for example. The details of the configuration of the control device 50 are described further below.

The wires 16, 17, and 18 are conductors that are electrically connected to the switching device 30, the control device 50, and the terminals 11*b*, 12, and 13, and aluminum conductive wires can be used as these wires 16, 17, and 18, for example. A plurality of the wires 16 are provided, and these wires 16 are connected respectively to the switching device 30 and the control device 50. The wire 17 connects the terminal 12 to the switching device 30 (specifically the emitter pad 33 included in the switching device 30). The wire 18 connects the terminal 13 to the control device 50 (specifically the gate pad 53 included in the control device 50).

The package 70 seals each configurational component described above therein, to protect these components. The package 70 seals the other side of the main body 11 and the switching device 30, the control device 50, and the base ends of the three terminals 11*b*, 12, and 13 therein, but does not seal the one side of the main body 11 of the lead frame 10, i.e. the top side in FIG. 1, and the tips of the three terminals 11*b*, 12, and 13. The package 70 is formed in a rectangular parallelepiped shape by being molded using resin having excellent insulating capability, such as epoxy.

The following provides a more detailed description of the switching device 30.

Figure 2:
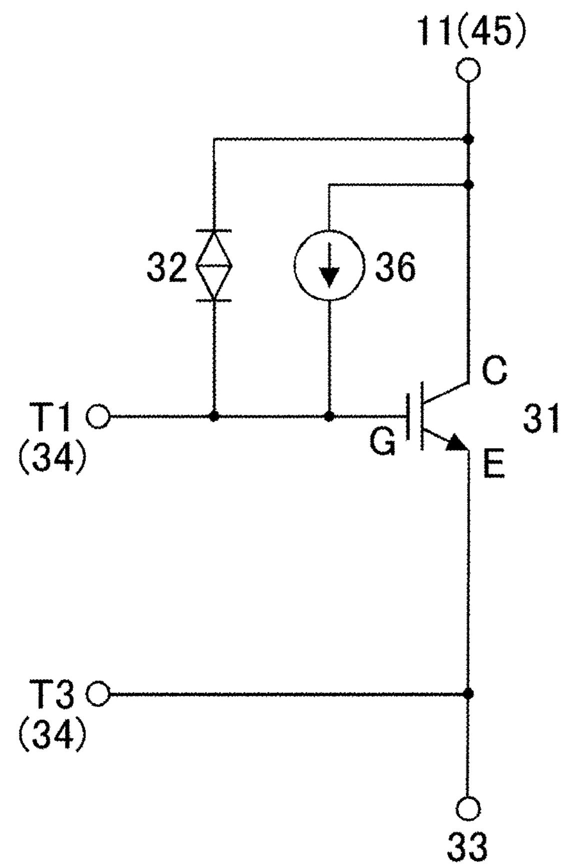
FIG. 2 shows a circuit configuration of the switching device.

FIG. 2 shows a circuit configuration of the switching device 30. The circuit of the switching device 30 is formed including the IGBT 31, a collector-gate Zener diode 32, and a current source 36. These configurational components are connected between pads T1 and T3, the emitter pad 33, and the main body 11 of the lead frame 10 described above, i.e. the collector electrode 45. It should be noted that the pad T3 shorts to the emitter pad 33.

The IGBT 31 is a switching element that receives a control signal from the control device 50 and cuts off the current flowing from the collector electrode to the emitter electrode. The IGBT 31 is connected between the pad T1, the emitter pad 33, and the main body 11 of the lead frame 10. Specifically, the gate terminal (G), the emitter terminal (E), and the collector terminal (C) of the IGBT 31 are respectively connected to the pad T1, the emitter pad 33 (and pad T3), and the main body 11 of the lead frame 10.

The collector-gate Zener diode (referred to as a CGZD) 32 is a Zener diode that ensures the withstand voltage of the IGBT 31. The CGZD 32 is connected between the pad T1 and the main body 11 of the lead frame 10, i.e. arranged between the gate terminal (G) and the collector terminal (C) of the IGBT 31. The CGZD 32 includes the number of Zener diodes needed to achieve the desired withstand voltage arranged in series. In this way, when the voltage between the gate terminal (G) and the collector terminal (C) exceeds the withstand voltage, the gate of the IGBT 31 is pulled up by the CGZD 32, and current flows between the collector terminal (C) and the emitter terminal (E) to lower the collector potential.

The current source 36 is an element for stabilizing the collector potential of the IGBT 31. The current source 36 is connected in parallel with the CGZD 32 between the pad T1 and the main body 11 of the lead frame 10, i.e. arranged between the gate terminal (G) and the collector terminal (C) of the IGBT 31. When current-limiting the ignitor 100 with the excessive current amount, the current source 36 restricts the overshoot of the current amount caused by the sudden switching due to the IGBT 31 by causing current to flow from the collector terminal (C) to the gate terminal (G) of the IGBT 31.

Figure 3:
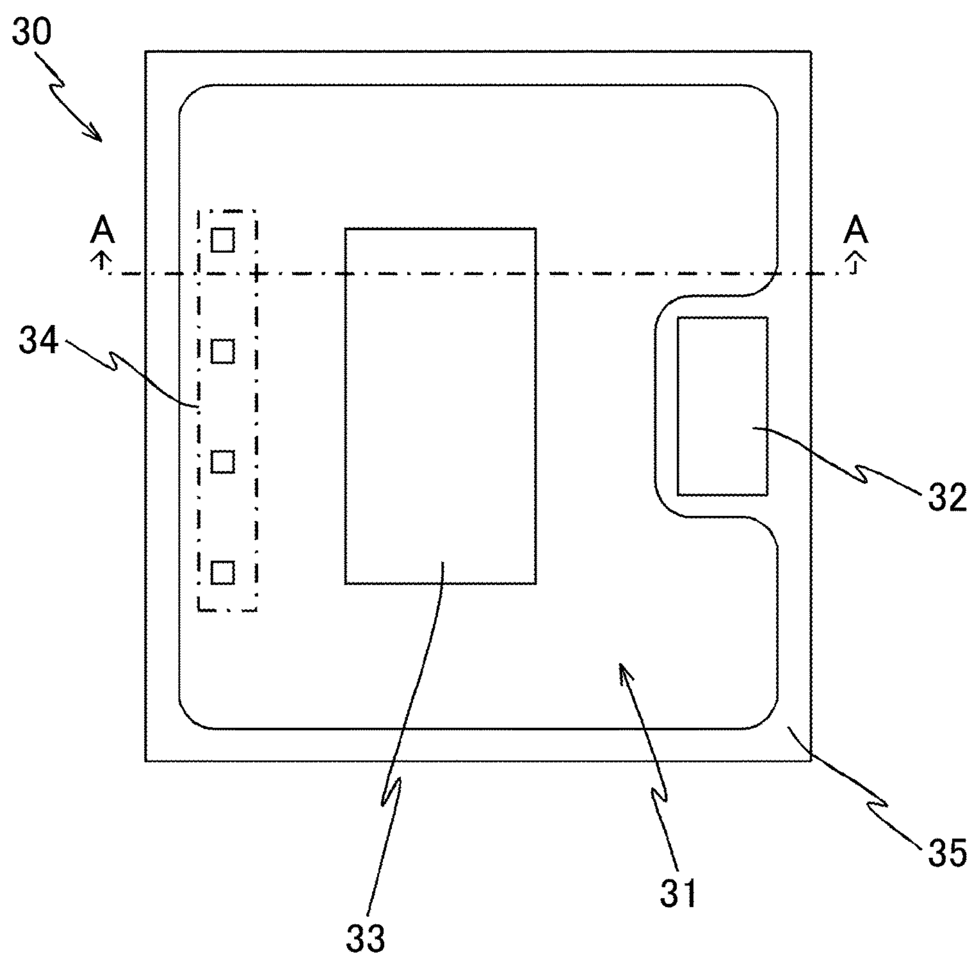
FIG. 3 shows a planar layout of the switching device in an overhead view.

FIG. 3 shows a planar layout of the switching device 30 in an overhead view. The switching device 30 includes the IGBT 31, the CGZD 32, the emitter pad 33, a plurality of electrode pads 34, a withstand voltage structure 35, and the current source 36 (not shown in FIG. 3; see FIG. 2).

The IGBT 31 is formed inside the chip, but not at the center of the end portion of the chip, i.e. the right end in FIG. 3, of the switching device 30. The configuration of the IGBT 31 is described further below, particularly the cross-sectional configuration.

The CGZD 32 is provided on the withstand voltage structure 35 between the IGBT 31 and the stopper electrode 28 (see FIG. 4) provided in the outer circumference of the chip of the switching device 30.

The emitter pad 33 is an electrode pad connected to the emitter terminal (E) of the IGBT 31, as described above. The emitter pad 33 is provided on the top surface of the chip center of the switching device 30. The emitter pad 33 is connected to the terminal 12 using the wire 17 (see FIG. 1) described above.

The plurality of electrode pads 34 are electrode pads for sending and receiving control signals, detection signals, and the like to and from the control device 50. For example, the electrode pads 34 include the pads T1 and T3 described above connected to the gate terminal (G) and the emitter terminal (E) of the IGBT 31. The plurality of electrode pads 34 are provided in parallel on the top surface near the end portion of the chip, i.e. the left end in FIG. 3, of the switching device 30. The plurality of electrode pads 34 are connected respectively to corresponding electrode pads 54 provided in the control device 50, using the wires 16 described above. In this way, the gate terminal (G) and the emitter terminal (E) of the IGBT 31 can be connected to the control device 50.

The withstand voltage structure 35 is a structure for protecting the circuits, circuit elements, and the like provided on the top surface side of the chip of the switching device 30 and the IGBT 31 from excessive voltage added to the main body 11 of the lead frame 10. The withstand voltage structure 35 is provided in an edge portion on the top surface of the chip and the periphery of the chip of the switching device 30 surrounding the IGBT 31. The configuration of the withstand voltage structure 35 is described further below, particularly the cross-sectional configuration.

The current source 36 (not shown in FIG. 3; see FIG. 2) can be configured using a depletion IGBT, for example. Here, the collector terminal of the depletion IGBT is connected to the collector terminal of the IGBT 31, and the gate terminal is clamped to the emitter terminal and connected to the gate terminal (G) of the IGBT 31.

The switching device 30 may be further provided with various sensors for detecting abnormalities of the switching device 30, such as a temperature sensor that measures the chip temperature, a current sensor that detects the collector current of the IGBT 31, and a voltage sensor that detects the voltage between the collector and emitter of the IGBT 31. Furthermore, a circuit that measures the ON time of the IGBT 31 on the basis of an ON signal may be provided, and the switching device 30 may be made to perform a timer operation.

Figure 4:
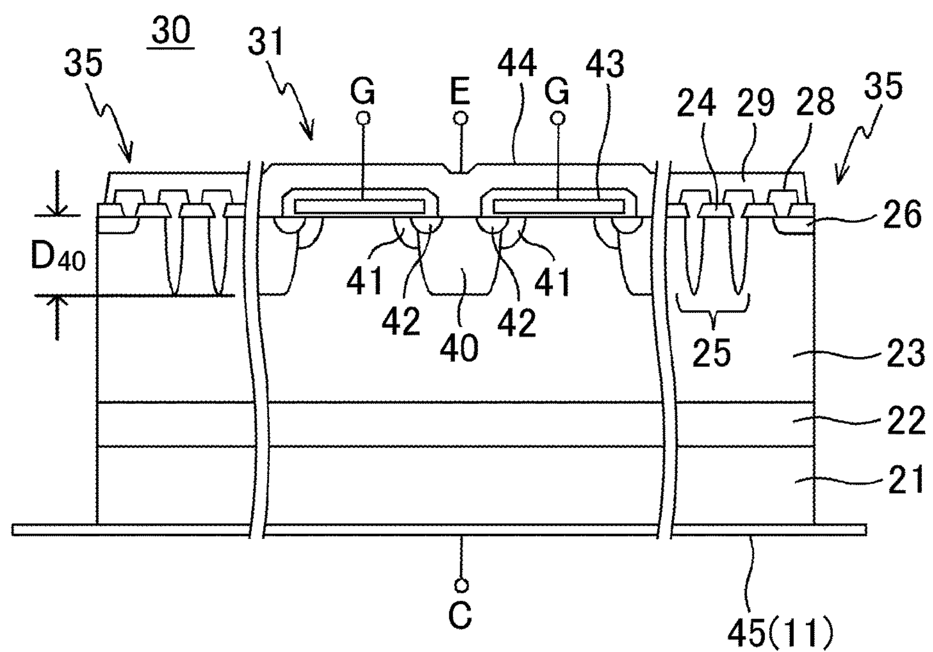
FIG. 4 is a cross-sectional view relating to the reference line AA in FIG. 3, and shows a cross-sectional structure of the switching device.

FIG. 4 is a cross-sectional view relating to the reference line AA in FIG. 3, and shows a cross-sectional structure of the switching device 30, particularly the IGBT 31 and the withstand voltage structure 35. The chip of the switching device 30 includes the main body 11 of the lead frame 10, i.e. the collector electrode 45, and a $p^+$-type semiconductor substrate 21 that becomes a $p^+$-type collector region, an $n^+$-type buffer region 22, and an $n^-$-type drift region 23 layered in the stated order on the collector electrode 45. The front surface element structure of the IGBT 31 is provided on the top surface of the $n^-$-type drift region 23, i.e. the center of the front surface layer of the chip, and the withstand voltage structure 35 is provided on the edge portion of the front surface layer and the chip periphery.

The front surface element structure of the IGBT 31 includes a $p^+$-type region 40, a p-type base region 41, an $n^+$-type emitter region 42, a gate electrode 43, and an emitter electrode 44. The $p^+$-type region 40 is a $p^+$-type well that is a contact region of the IGBT 31, and is arranged in the center of the front surface element. A plurality of the p-type base regions 41 are arranged to sandwich the $p^+$-type region 40 on both sides, i.e. the left side and right side in FIG. 4. The $n^+$-type emitter region 42 is arranged between each p-type base region 41 and the $p^+$-type region 40. The top surfaces of the $p^+$-type region 40, the p-type base regions 41, and the $n^+$-type emitter region 42, along with the top surface of the $n^-$-type drift region 23, form a single surface that is the front surface of the chip. The gate electrode 43 is covered by a gate insulating film, and is arranged above one of the p-type base regions 41. The emitter electrode 44 is arranged on and in contact with each of the $p^+$-type region 40, the p-type base regions 41, and the $n^+$-type emitter region 42.

The collector electrode 45 is a portion of the main body 11 of the lead frame 10, and contacts the entire back surface of the chip. The emitter electrode 44 is arranged on the front surface side of the chip, and the front surface element structure of the IGBT 31 including the $p^+$-type region 40, i.e. the $p^+$-type well, is provided corresponding to the emitter electrode 44 on the front surface side of the chip.

In a case where the switching device 30 includes a plurality of the IGBTs 31, as shown in FIG. 4, the gate electrode 43 may be arranged on one of the p-type base regions 41 included in each front surface element structure of two IGBTs 31 adjacent to each other with the $n^-$-type drift region 23 interposed therebetween.

In the present embodiment, the collector region of the IGBT 31, the region where the $p^+$-type region 40 is provided, and the base region are p-type and the buffer region, the drift region, and the emitter region are n-type, but this is merely one example, and instead the collector region, the region where the $p^+$-type region 40 is provided, and the base region may be n-type and the buffer region, the drift region, and the emitter region may be p-type.

The withstand voltage structure 35 is formed by providing an outer circumferential edge region with a constant width surrounding the front surface element structure of the IGBT 31 in the periphery of the chip. This region does not include carrier regions such as the $p^+$-type region 40 forming the front surface element structure. In this way, when a surge current flows from the emitter electrode 44 to the collector electrode 45 via the outer edge of the chip due to the occurrence of a negative surge, particularly by interposing the $n^-$-type drift region 23 with a sufficient width between the $p^+$-type region 40 under the emitter electrode 44 and the outer edge of the chip, a sufficient endurance is obtained.

The withstand voltage structure 35 is formed by further providing a $p^+$-type guard ring 25, an $n^+$-type channel stopper region 26, an insulating layer 24, a stopper electrode 28, and a passivation film 29 in the edge portion of the top surface of the chip, for example.

The $p^+$-type guard ring 25 is provided with a ring shape in the periphery of the top surface layer of the chip, in a manner to surround the front surface element structure of the IGBT 31. The number of $p^+$-type guard rings 25 is not limited to one, and a plurality of the $p^+$-type guard rings 25 may be provided, e.g. the $p^+$-type guard rings 25 may be arranged in two rings as shown in FIG. 4. The $n^+$-type channel stopper region 26 is provided in the outermost edge of the front surface layer of the chip, in a manner to surround the $p^+$-type guard ring 25. The insulating layer 24 is provided on the $n^-$-type drift region 23 interposed between adjacent $p^+$-type guard rings 25 and $n^+$-type channel stopper regions 26 among a plurality of $p^+$-type guard rings 25 and $n^+$-type channel stopper regions 26. The stopper electrode 28 is provided on the $n^+$-type channel stopper region 26. The passivation film 29 is formed using silicon nitride ($Si_3N_4$), for example, and covers the $p^+$-type guard ring 25, the $n^+$-type channel stopper region 26, the insulating layer 24 and the stopper electrode 28 to protect these portions.

By providing the circumferential edge region with a constant width in the periphery of the chip and/or providing the structure described above, when a surge voltage is applied from the collector electrode 45 to the emitter electrode 44 via the outer edge of the chip or when a surge voltage is applied from the emitter electrode 44 to the collector electrode 45 via the circumferential edge of the chip, the potential on the front surface of the chip remains stable by having this surge voltage pass through the circumferential edge region or the plurality of $p^+$-type guard rings 25 and the stopper electrode 28.

The following describes the control device 50 in greater detail.

Figure 5:
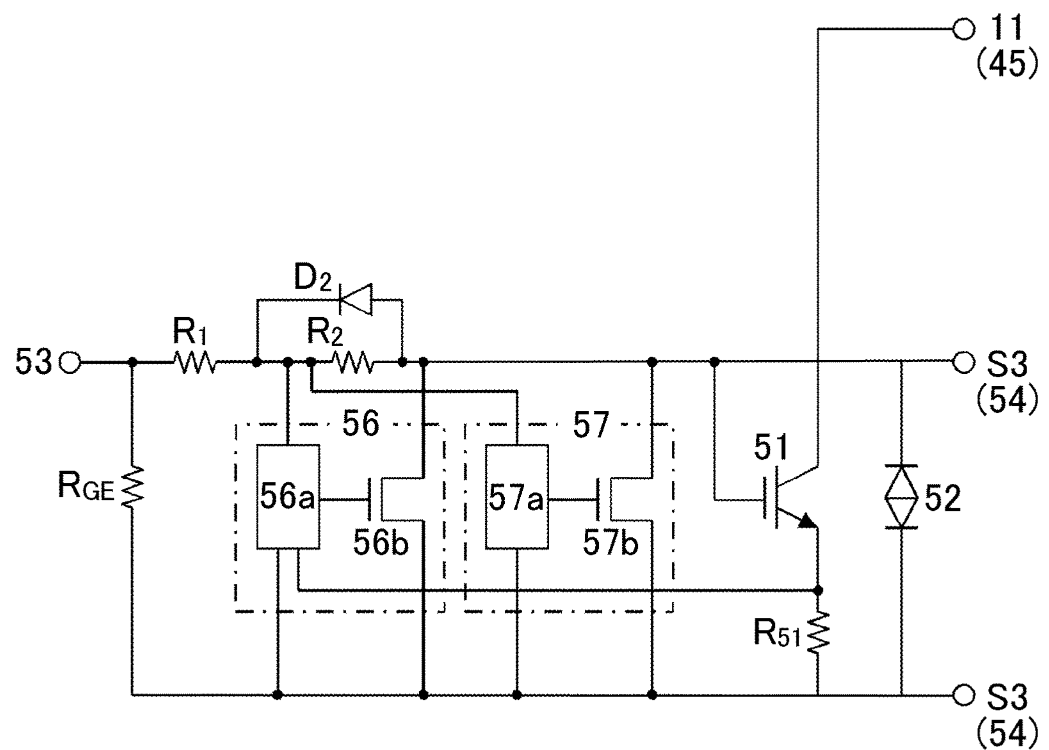
FIG. 5 shows a circuit configuration of the control device.

FIG. 5 shows a circuit configuration of the control device 50. The circuit of the control device 50 is configured including a sense IGBT 51 (sense resistor $R_{51}$), a gate-emitter Zener diode 52, control circuits 56 and 57 (resistors $R_1$ and $R_2$ and a diode $D_2$), and a resistor $R_{GE}$. These configurational components are connected between the pads S1 and S3, the gate pad 53, and the main body 11 of the lead frame 10 described above, i.e. the collector electrode 45.

The sense IGBT 51 is a sensing IGBT that simulates the IGBT 31 in the switching device 30 and detects the collector current amount. The sense IGBT 51 is connected between the main body 11 of the lead frame 10 and the pads S1 and S3. Specifically, the gate terminal and the collector terminal of the sense IGBT 51 are respectively connected to the pad S1 and the main body 11 of the lead frame 10, and the emitter terminal of the sense IGBT 51 is connected to the pad S3 via the sense resistor $R_{51}$.

The gate-terminal Zener diode (referred to as a GEZD) 52 is a Zener diode that protects the gate of the IGBT 31. The GEZD 52 is connected between the pads S1 and S3. Specifically, as described further below, the GEZD 52 is connected between the gate terminal (G) and the emitter terminal (E) of the IGBT 31 of the switching device 30, via the electrode pads 34 and 54 and the wires 16. The GEZD 52 includes the number of Zener diodes needed to achieve the desired withstand voltage arranged in series.

The control circuits 56 and 57 are circuits that detect abnormalities in the configurational components of the ignitor 100 or the IGBT 31 inside the switching device 30 and protect the control device 50.

The control circuit 56 controls the collector current amount of the IGBT 31 to be constant when this current exceeds a reference. As an example, the control circuit 56 is configured including a circuit portion 56*a* and an active element 56*b*. The control circuit 56 is connected along with the resistors $R_1$ and $R_2$ and the diode $D_2$ between the pads S1 and S3 and the gate pad 53. The circuit portion 56*a* is connected between the gate pad 53 and the pad S3, via the resistor $R_1$ connected between the circuit portion 56*a* and the gate pad 53. Furthermore, the emitter terminal of the sense IGBT 51 is connected to the circuit portion 56*a*. The active element 56*b* is connected between the pads S1 and S3. Furthermore, one end of the active element 56*b,* i.e. the drain, is connected to the resistor $R_1$ via the resistor $R_2$ and the diode $D_2$ provided in parallel.

The circuit portion 56*a* receives the detection result for the collector current amount of the IGBT 31 from the sense IGBT 51 and, if this collector current amount is greater than (or less than) a reference, transmits an ON signal (or OFF signal) to the active element 56*b*. The active element 56*b,* upon receiving the ON signal from the circuit portion 56*a,* outputs a control signal to pull down (maintain) the gate of the IGBT 31. The control signal of the control circuit 56 is input to the gate terminal (G) of the IGBT 31 of the switching device 30. The IGBT 31 is turned ON and OFF by receiving the control signal, thereby controlling the collector current amount to be constant by increasing or decreasing this collector current amount to the reference.

The control circuit 57 turns OFF the IGBT 31 when there is an abnormality in the switching device 30. As an example, the control circuit 57 is configured including a circuit portion 57*a* and an active element 57*b*. The circuit portion 57*a* is connected between the gate pad 53 and the pad S3, via the resistor $R_1$ connected between the circuit portion 57*a* and the gate pad 53. The active element 57*b* is connected between the pads S1 and S3.

The circuit portion 57*a* detects the chip temperature of the switching device 30 using a temperature sensor provided in the switching device 30, for example. Furthermore, the circuit portion 57*a* may detect the chip temperature of the control device 50 using a temperature sensor provided in the control device 50. When the chip temperature is higher than a reference, the circuit portion 57*a* judges that the switching device 30 is in an abnormal state and transmits the ON signal to the active element 57*b*. The active element 57*b,* upon receiving the ON signal from the circuit portion 57*a,* outputs a control signal to pull down the gate of the IGBT 31. The control signal of the control circuit 57 is input to the gate terminal (G) of the IGBT 31 of the switching device 30. The IGBT 31 is turned OFF by receiving the control signal, thereby cutting of the collector current.

The abnormality of the switching device 30 is not limited to the chip temperature, and may also be detected from quantities of other states of the chip or quantities of other states of the IGBT 31. Quantities of the state of the IGBT 31 are exemplified by the length of the ON time of the IGBT 31, the collector current amount of the IGBT 31, and the voltage between the collector and emitter of the IGBT 31, for example. The control circuit 57 can obtain these state quantities from various sensors provided in the switching device 30.

The control circuits 56 and 57 may use the signal voltage of the control signal supplied from an ECU as the power supply voltage, or may use the power supply voltage supplied from a power supply independent from the ECU.

The resistor $R_{GE}$ is connected between the gate pad 53 and the pad S3 among the plurality of electrode pads 54.

In addition, a capacitor for preventing noise, a resistor or Zener diode for protecting the power supply, and the like may be provided. Furthermore, a ground terminal that is independent from the switching device 30 may be provided.

Figure 6:
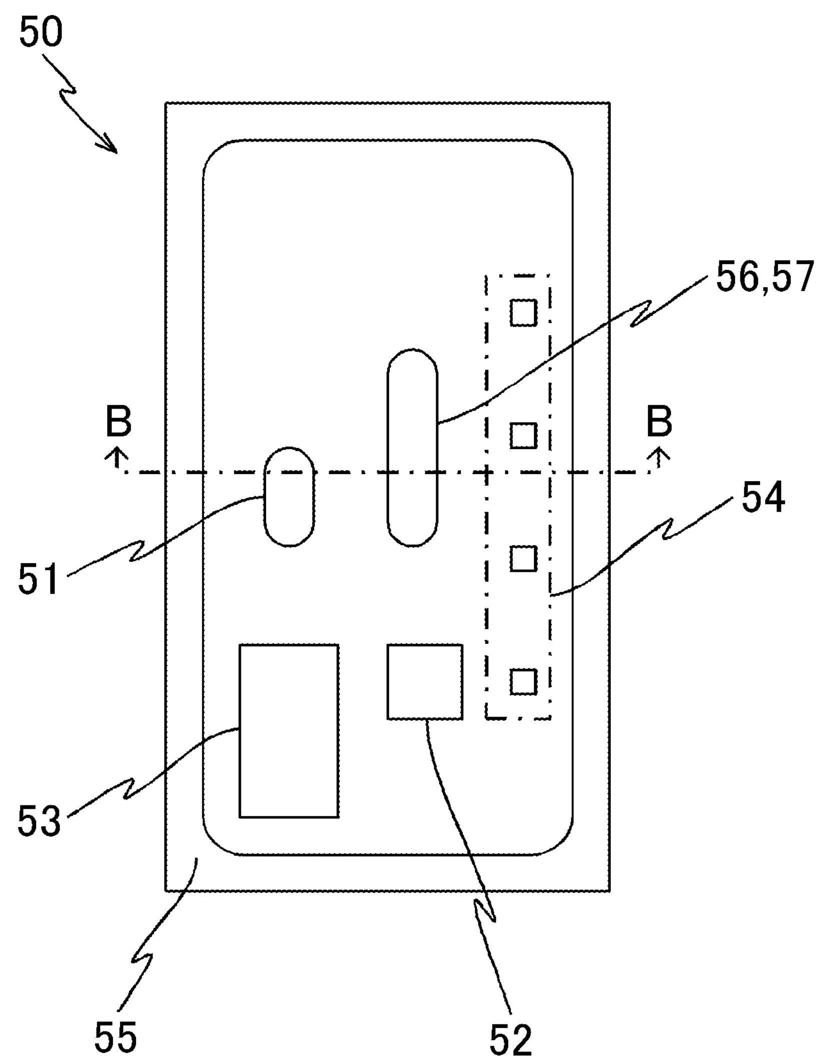
FIG. 6 shows a planar layout of the control device in an overhead view.

FIG. 6 shows a planar layout of the control device 50 in an overhead view. The control device 50 includes the sense IGBT 51, the gate-emitter Zener diode 52, the gate pad 53, the plurality of electrode pads 54, the withstand voltage structure 55, and the control circuits 56 and 57.

The sense IGBT 51 is formed inside the chip to one side, i.e. the left side in FIG. 6, of the center of the chip of the control device 50. The configuration of the sense IGBT 51 is described further below, particularly the cross-sectional configuration.

In the present embodiment, in order to efficiently utilize the chip size of the switching device 30 or to not detect the parasitic current of the IGBT 31, the sense IGBT 51 is provided in the control device 50, but the present invention is not limited to this, and the sense IGBT 51 may be provided in the switching device 30 along with a structure for cutting off the parasitic current of the IGBT 31 as needed, and may transmit the detection result of the sense IGBT 51 to the control circuit 57 inside the control device 50 via the electrode pads 34 and 54 and the wires 16.

The GEZD 52 is provided on the front surface of the chip on one side, i.e. the bottom side in FIG. 6, of the center of the chip of the control device 50. The GEZD 52 may be provided in the switching device 30.

The gate pad 53 is an electrode pad connected to the gate terminal (G) of the IGBT 31 of the switching device 30 via the electrode pads 34 and 54 and the wires 16. The gate pad 53 is installed on the top surface of the control device 50 near a corner portion, i.e. the corner portion in the bottom left in FIG. 6, of the chip. The gate pad 53 is connected to the terminal 13 via the wire 18 described above (see FIG. 1).

The plurality of electrode pads 54 are electrode pads for sending and receiving control signals, detection signals, and the like to and from the switching device 30. As an example, the electrode pads 54 include the pads S1 and S3 described above. The plurality of electrode pads 54 are arranged in parallel on the top surface of the control device 50 near the end portion, i.e. the right end in FIG. 6, of the chip. The plurality of electrode pads 54 (specifically the pads S1 and S3 among these electrode pads 54) are respectively connected to corresponding electrode pads 34 (specifically the pads T1 and T3 among these electrode pads 34) provided in the switching device 30 by the plurality of wires 16. In this way, the pads S1 and S3 included among the plurality of electrode pads 54 are respectively connected to the gate terminal (G) and the emitter terminal (E) of the IGBT 31 included in the switching device 30.

The withstand voltage structure 55 is a structure for protecting the various control circuits and the like provided on the top surface side of the chip of the control device 50 from excessive voltage added to the main body 11 of the lead frame 10. The withstand voltage structure 55 is provided in the edge portion of the top surface of the chip and the periphery of the chip of the control device 50 surrounding the sense IGBT 51 and the like. The configuration of the withstand voltage structure 55 is described further below, particularly the cross-sectional configuration.

The control circuits 56 and 57 are formed inside the chip in the center of the chip of the control device 50, i.e. on the right side of the sense IGBT 51 in the drawing, for example. The configuration of the active elements forming the control circuits 56 and 57 is described further below, particularly a cross-sectional configuration.

In a case where the power supply voltage is received from a power supply that is independent from the ECU, an interface electrode pad (not shown in the drawings) that is connected to the power supply and supplies the power supply voltage to the control circuits 56 and 57 may be provided. The interface electrode pad can be connected to the power supply terminal provided in parallel with the terminals 11*b,* 12, and 13 via the wires (not shown in the drawings).

Figure 7:
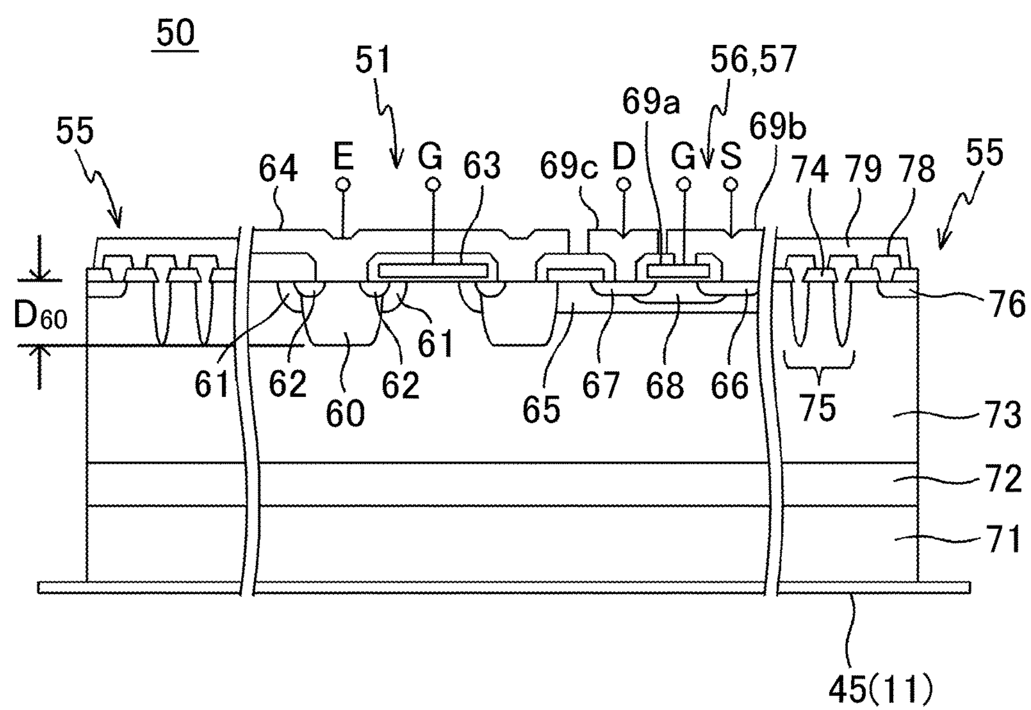
FIG. 7 is a cross-sectional view relating to the reference line BB shown in FIG. 6, and shows a cross-sectional structure of the control device.

FIG. 7 is a cross-sectional view relating to the reference line BB shown in FIG. 6 and shows a cross-sectional structure of the control device 50, particularly the sense IGBT 51, the active elements forming the control circuits 56 and 57, and the withstand voltage structure 55. In the same manner as the chip of the switching device 30, the chip of the control device 50 includes the main body 11 of the lead frame 10, i.e. the collector electrode 45, and a $p^+$-type semiconductor substrate 71 that becomes a $p^+$-type collector region, an $n^+$-type buffer region 72, and an $n^-$-type drift region 73 layered in the stated order on the collector electrode 45. Furthermore, a p-type base region 65 is provided on the $n^-$-type drift region 73 to the right side of the center of the front surface layer of the chip. The front surface element structure of the sense IGBT 51 is provided on the left side of the top surface of the chip, i.e. on the $n^-$-type drift region 73, the active elements forming the control circuits 56 and 57 are provided on the right side of the front surface layer of the chip, i.e. the on the p-type base region 65, and the withstand voltage structure 55 is provided on the edge portion of the front surface layer and the periphery of the chip.

The front surface element structure of the sense IGBT 51 includes a $p^+$-type region (i.e. a $p^+$-type well) 60, a p-type base region 61, an $n^+$-type emitter region 62, a gate electrode 63, and an emitter electrode 64. These components are formed in the same manner as in the IGBT 31 of the switching device 30, except for the points described below.

The diffusion depth $D_{60}$ of the $p^+$-type region 60 is less than the diffusion depth $D_{40}$ of the $p^+$-type region 40 of the switching device 30, i.e. $D_{60}<D_{40}$. In other words, the thickness of the $n^-$-type drift region 73 between the $p^+$-type region 60 and the $n^+$-type buffer region 72 is greater than the thickness of the $n^-$-type drift region 23 between the $p^+$-type region 40 and the $n^+$-type buffer region 22 in the switching device 30. In this way, the withstand voltage of the control device 50 becomes approximately equal to (e.g. 600 V) or higher than (e.g. 700 V) the withstand voltage of the switching device 30. Accordingly, when a positive surge voltage occurs, the IGBT 31 is punched through before the sense IGBT 51 and the surge current selectively flows (i.e. is latched up) through the switching device 30 having the higher breakdown withstand amount, and therefore the control device 50, and particularly the control circuits 56 and 57 having a low breakdown withstand amount, are protected.

This is particularly effective in a case where the application of a surge voltage is more sudden than the operation of a protective circuit such as the CGZD 32, such as in the case of an electrostatic discharge surge (ESD surge).

The impurity concentration of the $n^+$-type buffer region 72 is less than the impurity concentration of the $n^+$-type buffer region 22 of the switching device 30. In this way, the withstand voltage between the emitter and collector of the control device 50 becomes equal to or higher than the withstand voltage between the emitter and collector of the switching device 30. Accordingly, when a negative surge occurs, the surge current selectively flows through the switching device 30 having a high breakdown withstand amount, and therefore the control device 50, and particularly the control circuits 56 and 57 having a low breakdown withstand amount, are protected.

The active elements of the control circuits 56 and 57 include depletion MOSFETs, for example, and have an $n^+$-type source region 66, an $n^+$-type drain region 67, an $n^-$-type region 68, a gate electrode 69*a*, a source electrode 69*b*, and a drain electrode 69*c*. The $n^+$-type source region 66 and the $n^+$-type drain region 67 are respectively arranged on one side and another side, i.e. the right side and the left side in FIG. 7, on the front surface of the p-type base region 65. The $n^-$-type region 68 is an n-type region with a lower impurity concentration than the $n^+$-type source region 66 and the $n^+$-type drain region 67, and is arranged between the $n^+$-type source region 66 and the $n^+$-type drain region 67 on the front surface of the p-type base region 65. The gate electrode 69*a* is covered by the gate insulating film and arranged on the $n^-$-type region 68. The source electrode 69*b* is arranged on and in contact with the $n^+$-type source region 66. The drain electrode 69*c* is arranged on and in contact with the $n^+$-type drain region 67.

The collector electrode 45 is a portion of the main body 11 of the lead frame 10 and is in contact with the entire back surface of the chip. The collector electrode 45 is shared with the switching device 30. The emitter electrode 64 is arranged on the front surface side of the chip, and the front surface element structure of the sense IGBT 51 including the $p^+$-type region 60 ($p^+$-type well) corresponding to the emitter electrode 64 and the active elements forming the control circuits 56 and 57 are provided on the front surface side of the chip.

In the present embodiment, the collector region of the sense IGBT 51, the region where the $p^+$-type region 60 is provided, and the base region are p-type and the buffer region, the drift region, and the emitter region are n-type, but this is merely one example, and instead the collector region, the region where the $p^+$-type region 60 is provided, and the base region may be n-type and the buffer region, the drift region, and the emitter region may be p-type. Furthermore, the base region of the active elements forming the control circuits 56 and 57 is p-type and the source region, the drain region, and the region where the $n^-$-type region 68 is provided are n-type, but this is merely one example, and instead the base region may be n-type and the source region, the drain region, and the region where the $n^-$-type region 68 is provided may be p-type.

In the control device 50, the active elements forming the control circuits 56 and 57 are provided on the $p^+$-type semiconductor substrate 71, the $n^+$-type buffer region 72, and the $n^-$-type drift region 73 layered in the stated order on the main body 11 of the lead frame 10, i.e. the collector electrode 45. These regions are shared with the $p^+$-type semiconductor substrate 21, the $n^+$-type buffer region 22, and the $n^-$-type drift region 23 of the switching device 30. Accordingly, by including these regions, the control device 50 realizes an endurance at least approximately equal to the endurance of the switching device 30 and, in particular, realizes an endurance with respect to the excessive voltage added between the emitter electrode and the collector electrode.

The withstand voltage structure 55 is formed by providing a circumferential edge region with a constant width surrounding the front surface element structure of the sense IGBT 51, the active elements of the control circuits 56 and 57, and the like in the periphery of the chip. This region does not include carrier regions such as the $p^+$-type region 60 forming the front surface element structure. In this way, when a surge current flows from the emitter electrode 64 to the collector electrode 45 via the outer edge of the chip due to the occurrence of a negative surge, particularly by interposing the $n^-$-type drift region 73 with a sufficient width between the $p^+$-type region 60 under the emitter electrode 64 and the outer edge of the chip, a sufficient endurance is obtained.

The withstand voltage structure 55 is formed by further providing a $p^+$-type guard ring 75, an $n^+$-type channel stopper region 76, an insulating layer 74, a stopper electrode 78, and a passivation film 79 in the edge portion of the top surface of the chip, for example. These components are formed in the same manner as in the withstand voltage structure 35 of the switching device 30. In this way, when a surge voltage is applied from the collector electrode 45 to the emitter electrode 64 via the outer edge of the chip or when a surge voltage is applied from the emitter electrode 64 to the collector electrode 45 via the outer edge of the chip, the potential on the front surface of the chip remains stable by having this surge voltage pass through the circumferential edge region or the plurality of $p^+$-type guard rings 75 and the stopper electrode 78.

By providing the withstand voltage structure to the control device 50 in the same manner as the switching device 30, it is possible to share the collector electrode 45 between the control device 50 and the switching device 30, i.e. it is possible to share the collector potential. In this way, a separation frame, an insulating layer, and the like for separating the potentials of respective chips from each other becomes unnecessary, and it is possible to simply configure each chip.

Furthermore, by setting the withstand voltage structure 55 to have a greater width than the circumferential edge region, for example, the withstand voltage structure 55 is configured to have a higher withstand voltage than the withstand voltage structure 35 of the switching device 30. In this way, the control device 50 has a higher withstand voltage with respect to the excessive voltage added between the emitter electrode 64 and the collector electrode 45 than the switching device 30, and by causing the surge current to selectively flow through the switching device 30 having a high breakdown withstand amount when a negative surge occurs, for example, the control device 50, and particularly the control circuits 56 and 57 having a low breakdown withstand amount, are protected.

The CGZD 32 functions for a low surge voltage, the withstand voltage caused by the difference in the diffusion depth between the $p^+$-type regions 40 and 60 functions for a medium surge voltage, and the difference in withstand voltages between the withstand voltage structures 35 and 55 functions for a high surge voltage, thereby protecting the control circuits 56 and 57.

Figure 8:
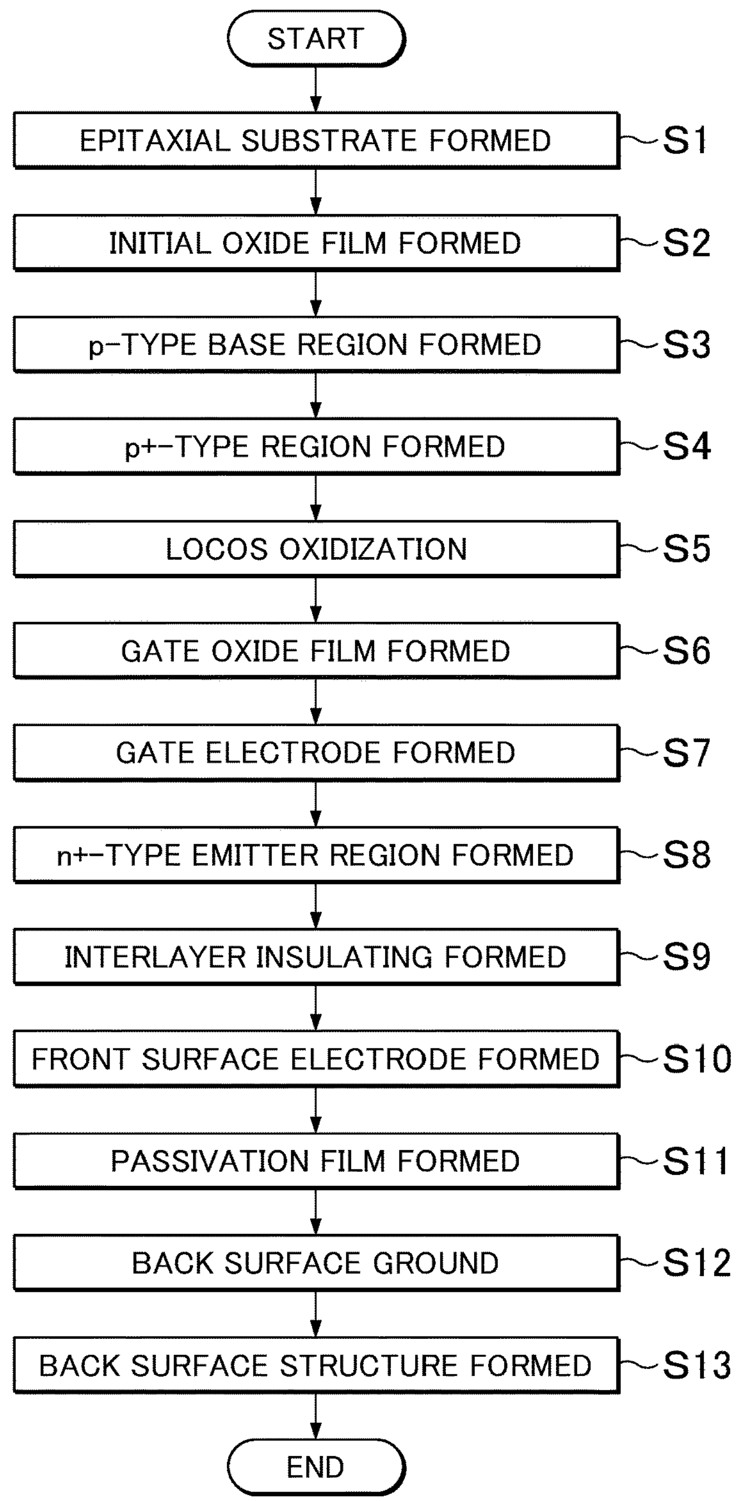
FIG. 8 shows a manufacturing flow of the ignitor.

FIG. 8 shows a manufacturing flow of the switching device 30 and the control device 50 included in the ignitor 100. It should be noted that, since the manufacturing flow is almost the same for the switching device 30 and the control device 50, the manufacturing flow of the switching device 30 is described here.

At step S1, an epitaxial substrate is formed. The epitaxial substrate is formed by epitaxially growing the $n^+$-type buffer region 22 and the $n^-$-type drift region 23 in the stated order on the top surface of the $p^+$-type semiconductor substrate 21 that will become the $p^+$-type collector region. The front surface element structure of the IGBT 31 is formed on the epitaxial substrate, i.e. on the $n^-$-type drift region 23.

At step S2, an initial oxide film is formed on the top surface of the epitaxial substrate, i.e. on the top surface of the $n^-$-type drift region 23, using thermal oxidization, for example.

At step S3, the p-type base region 41 is formed. The p-type base region 41 is formed by forming a resist mask that has an opening corresponding to the shape of the p-type base region 41 through photolithography and etching, implanting p-type impurities using this resist mask, and activating the p-type impurities through thermal processing (channel drive).

At step S4, the $p^+$-type region 40 is formed. The $p^+$-type region 40 is formed by forming an oxide film mask having an opening corresponding to the shape of the $p^+$-type region 40 by patterning the initial oxide film, implanting p-type impurities by using this oxide mask, and activating the p-type impurities through thermal processing (well drive). After the activation, the oxide film mask is removed.

At step S5, a LOCOS film is formed through LOCOS oxidization between each of the elements of the IGBT 31.

At step S6, a gate oxide film is formed on the epitaxial substrate.

At step S7, the gate electrode 43 is formed. An undoped polysilicon film is deposited on the gate oxide film, the epitaxial substrate is exposed to a phosphoryl chloride ($POCl_3$) gas atmosphere, for example, and the polysilicon film is made n-type. As an example, the polysilicon film doped to be n-type may be formed by depositing polysilicon that is doped to be n-type. The gate electrode 43 is formed by patterning this polysilicon film.

At step S8, the $n^+$-type emitter region 42 is formed. The $n^+$-type emitter region 42 is formed by forming a resist mask having an opening corresponding to the shape of the $n^+$-type emitter region 42 through photolithography and etching, implanting n-type impurities using this resist mask, and activating the n-type impurities through thermal processing.

At step S9, an interlayer insulating film such as BPSG (boro-phospho silicate glass) is formed on the top surface of the epitaxial substrate.

At step S10, the front surface electrode is formed. The interlayer insulating film is selectively removed to form contact holes in which the $p^+$-type guard ring 25 and the like are exposed. An aluminum silicon (Al—Si) film, for example, is deposited on the entire top surface of the epitaxial layer. The front surface electrodes such as the emitter electrode 44 and the stopper electrode 28 of the IGBT 31 are formed by patterning this aluminum-silicon film.

At step S11, the entire top surface of the epitaxial substrate is covered by a passivation film (protective film).

At step S12, the back surface of the epitaxial substrate, i.e. the $p^+$-type semiconductor substrate 21, is ground down to set the thickness of the substrate.

At step S13, the back surface structure is formed. The epitaxial substrate is installed on the main body 11 of the lead frame 10, and the collector electrode 45 is formed on the entire back surface of the substrate. In this way, the switching device 30 is completed.

Figure 9:
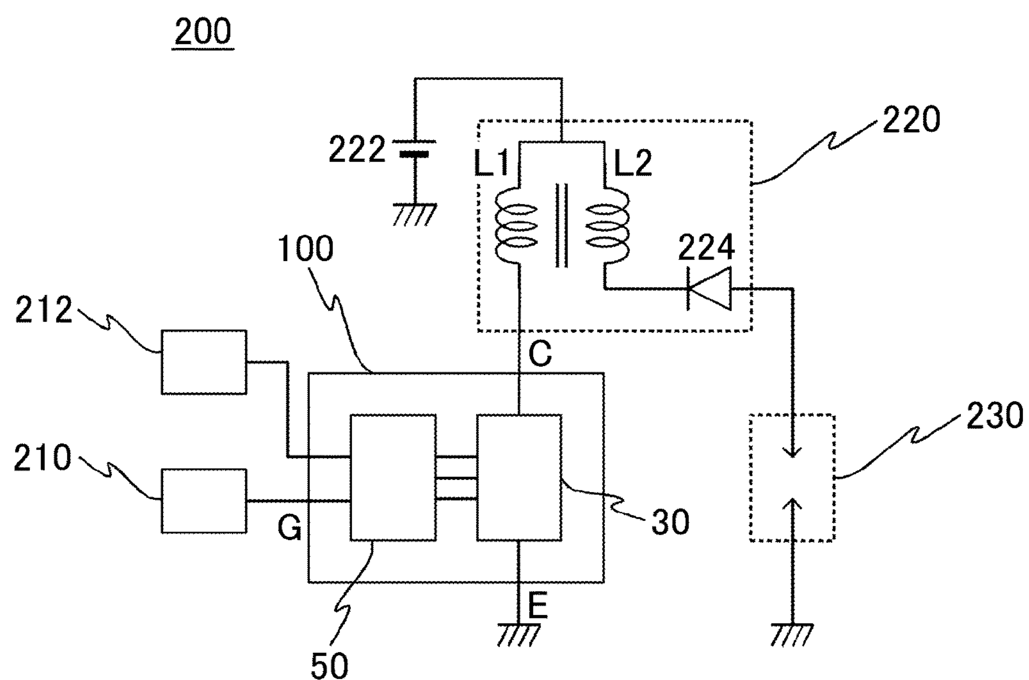
FIG. 9 shows a configuration of an ignition device including the ignitor.

FIG. 9 shows a configuration of an ignition device 200 including the ignitor 100. The ignition device 200 is provided in internal combustion equipment of an automobile engine, for example, and is configured including the ignitor 100, an ECU 210, an ignition coil 220, and an ignition plug 230.

The ignitor 100 is the switch apparatus described above as an example, and switches whether current flows through a primary coil L1 of the ignition coil 220 by using the switching device 30 included therein. The terminal (gate terminal) 13 of the ignitor 100 is connected to the ECU 210, the terminal (collector terminal) 11*b* is connected to the primary coil L1 of the ignition coil 220, and the terminal (emitter terminal) 12 is connected to a vehicle body serving as a ground.

The ECU 210 transmits a control signal to the ignitor 100 and controls the operation of the ignitor 100, i.e. the operation of the engine.

An external power supply (not shown in the drawings) may be further provided as an interface power supply of the ignitor 100. The external power supply can be used as needed when the signal voltage of the control signal of the ECU is low or drops significantly, when the power supply must be provided to a large number of interfaces, or the like. The external power supply is connected to an interface electrode pad (not shown in the drawings) of the control device 50 of the ignitor 100, and supplies the power supply voltage to the control circuits 56 and 57 and the like.

The ignition coil 220 is a transformer that generates a high voltage discharged by the ignition plug 230. The ignition coil 220 includes the primary coil L1 and the secondary coil L2. One end of the primary coil L1 is connected to the power supply 222, and the other end is connected to the terminal (collector terminal) 11*b* of the ignitor 100, i.e. the switching device 30. One end of the secondary coil L2 is connected to the power supply 222, and the other end is connected to the ignition plug 230 via the diode 224.

The ignition plug 230 is provided in the combustion chamber of the internal combustion equipment, and discharges the high voltage supplied from the ignition coil 220 to ignite a mixed gas including fuel and air.

In the ignition device 200, the ignitor 100 receives a control signal (ON signal) from the ECU 210 and turns ON the IGBT 31 in the switching device 30. In this way, electricity is conducted by the primary coil L1 of the ignition coil 220. The ignitor 100 receives a control signal (OFF signal) from the ECU and turns OFF the IGBT 31. In this way, the conduction of the primary coil L1 of the ignition coil 220 is cut off. When this cutoff is performed, a voltage of approximately 300 V occurs in the primary coil L1 of the ignition coil 220, which causes a voltage of approximately 30 kV to occur in the secondary coil L2 and be discharged by the ignition plug 230.

With the ignitor 100 according to the present embodiment, by forming the switching device 30 and the control device 50 in independent chips, the parasitic current of the IGBT 31 included in the switching device 30 does not flow through the control device 50, and operational errors in the control circuit included therein caused by the parasitic current do not occur. Furthermore, by making a self-separating region for cutting off the parasitic current of the IGBT unnecessary, the chips can be configured to be more compact.

The switch apparatus according to the present embodiment is, as an example, an ignitor for igniting a mixed gas using an ignition plug in an automobile engine, but the present invention is not limited to this and can be used as a switch apparatus used in a power device such as a drive motor, for example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above description, with an embodiment of the present invention, it is possible to realize a switch apparatus and an ignition device that ensure a field decay endurance while minimizing the chip size in a multichip ignitor and, in particular, protects control circuits.

What is claimed is:

1. A switch apparatus comprising:
a conductor;
a switching device that contacts the conductor on a first surface and switches between a first terminal on the first surface side and a second terminal on a second surface side that is opposite to the first surface; and
a control device that contacts the conductor on a third surface and includes a control circuit of the switching device provided on a fourth surface side opposite to the third surface and a first withstand voltage structure that protects the control circuit from excessive voltage added to the conductor.

2. The switch apparatus according to claim 1, wherein
the first withstand voltage structure is provided on an edge portion of the fourth surface of the control device.

3. The switch apparatus according to claim 1, wherein
the switching device includes a second withstand voltage structure that protects a circuit on the second surface side from excessive voltage added to the conductor.

4. The switch apparatus according to claim 1, wherein
the control device has a higher withstand voltage between the surfaces thereof than the switching device.

5. The switch apparatus according to claim 1, wherein
the control device and the switching device include, in order from a conductor side, a first-conductivity-type collector layer, a second-conductivity-type buffer layer, a second-conductivity-type drift layer, and a first-conductivity-type well provided to correspond to an emitter terminal on a surface side opposite to the conductor.

6. The switch apparatus according to claim 5, wherein
the control device has a thicker second-conductivity-type drift layer between the first-conductivity-type well and the second-conductivity-type buffer layer than the switching device.

7. The switch apparatus according to claim 5, wherein
the control device has a lower impurity concentration in the second-conductivity-type buffer layer than the switching device.

8. The switch apparatus according to claim 1, wherein
the control circuit inputs a control signal designating whether the switching device is to be turned ON, and
the control circuit controls a gate voltage of a switch element inside the switching device according to the control signal, using the control signal as a power supply.

9. The switch apparatus according to claim 1, wherein
the switching device includes an insulated gate bipolar transistor as a switch element.

10. The switch apparatus according to claim 1, wherein
the switch apparatus functions as an ignitor, and
the switching device switches whether current flows through a primary coil of an ignition coil.

11. An ignition device comprising:
the switch apparatus according to claim 1;
a control apparatus that controls the switch apparatus; and
an ignition coil that includes a primary coil connected to the switching device of the switch apparatus and a secondary coil connected to an ignition plug of internal combustion equipment.

12. A switch apparatus comprising:
a conductor;
a switching device that contacts the conductor on a first surface and switches between a first terminal on the first surface side and a second terminal on a second surface side that is opposite to the first surface; and
a control device that contacts the conductor on a third surface and includes a control circuit of the switching device provided on a fourth surface side opposite to the third surface, wherein
the control device has a higher withstand voltage between the surfaces thereof than the switching device.combustion equipment.

* * * * *